United States Patent
Thakur

[11] Patent Number: 5,994,240
[45] Date of Patent: Nov. 30, 1999

[54] METHOD FOR CLEANING SEMICONDUCTOR WAFERS

[75] Inventor: Randhir P. S. Thakur, Boise, Id.

[73] Assignee: Micron Technology, Inc., Boise, Id.

[21] Appl. No.: 08/915,517

[22] Filed: Aug. 13, 1997

Related U.S. Application Data

[63] Continuation of application No. 08/674,782, Jul. 3, 1996, abandoned.

[51] Int. Cl.$^6$ .................................................... H01L 21/31
[52] U.S. Cl. ........................... 438/758; 438/905; 438/906
[58] Field of Search .................... 438/674, 713, 438/714, 723, 724, 758, 905, 906

[56] References Cited

U.S. PATENT DOCUMENTS

| | | | |
|---|---|---|---|
| 4,786,352 | 11/1988 | Benzing | 156/345 |
| 5,089,441 | 2/1992 | Moslehi | 437/225 |
| 5,180,435 | 1/1993 | Markunas et al. | 118/723 |
| 5,264,396 | 11/1993 | Thakur et al. | 437/238 |
| 5,296,258 | 3/1994 | Tay et al. | 427/96 |
| 5,326,723 | 7/1994 | Petro et al. | 437/192 |
| 5,403,434 | 4/1995 | Moslehi | 156/643 |
| 5,413,670 | 5/1995 | Lagan et al. | 134/1.2 |
| 5,472,508 | 12/1995 | Saxena | 118/723 E |
| 5,658,391 | 8/1997 | Buley et al. | 134/1.1 |

*Primary Examiner*—Chandra Chaudhari
*Assistant Examiner*—Reneé R. Berry
*Attorney, Agent, or Firm*—Schwegman, Lundberg, Woessner & Kluth P.A.

[57] ABSTRACT

A low temperature in-situ precleaning process for a semiconductor surface is disclosed. Ambient reactant gases, such as $NF_3$ and $GeH_4$, having a partial pressure of between approximately $10^{-8}$ and 700 Torr, are pulsed in a batch furnace at temperatures in the approximate range of 250 to 950 degrees Celsius and pressure in the approximate range of $4 \times 10^3$ to $20 \times 10^3$ Torr. This forms material on the surface that easily vaporizes in that temperature and pressure range, providing a clean surface for formation of the next layer. A similar in-situ cleaning process is performed at temperature ranges of between approximately 300 to 1,000 degrees Celsius for the equipment utilized in processing semiconductor substrates.

33 Claims, 1 Drawing Sheet

METHOD FOR CLEANING SEMICONDUCTOR WAFERS

This application is a continuation of U.S. patent application Ser. No. 08/674,782, filed on Jul. 3, 1996 now abandoned.

FIELD OF THE INVENTION

The present invention relates to the formation of semiconductor devices, and in particular to methods for the cleaning of semiconductor wafers and equipment, during fabrication.

BACKGROUND OF THE INVENTION

During fabrication of semiconductor devices, many layers are deposited on semiconductor wafers while they are situated in furnaces. Targeted deposition areas are often not precisely controlled. Thus, deposited material accumulates on walls of the furnace, as well as on the semiconductor wafers, where it is desired. Furthermore, during deposition, the furnace tubes accumulate the material which is deposited. During fabrication, steps are taken to clean the tubes and walls of the furnace, in order to avoid obstruction of depositions due to large accumulations of prior-deposited materials. Prior-deposited materials are also unwanted in a fabrication furnace because they tend to introduce impurities into subsequently-deposited layers.

As multiple layers are formed in semiconductor devices, individual layers may also need to be cleaned before the next layer is formed or before surface modification is done. Numerous preclean procedures exist for use prior to semiconductor surface modification in batch furnaces, including wet chemical cleans, hydrogen ($H_2$) bakes and hydrofluoric acid (HF) vapor cleans. Preclean procedures are important to both reduce native oxide and remove other contaminants, such as residual organic and metallic impurities.

One desire, to ensure a low cost of batch production of ultra large scale integrated (ULSI) semiconductor devices, is to clean the surfaces in-situ, or in other words, without moving the semiconductor wafers into a different device specifically for cleaning. Given the large number of wafers being used for semiconductor integrated circuit (IC) manufacturing, which are being processed in batch-type furnaces, the cleaning of furnace tubes and precleaning of wafers at different processing stages becomes difficult. It is expensive and time consuming to move and precisely align the wafers to a separate cleaning area between formation of different layers. The transfer also increases the chances of contamination, or requires increased expense in preventing contamination and reduces throughput.

In-situ cleans have been accomplished somewhat by using $H_2$ bakes and HF vapor cleans in standard cluster types of vertical and horizontal batch furnaces. However, to achieve uniformity of the clean, high temperatures (1,000 to 1,200 degrees Celsius) are required for the $H_2$ bake and chemicals must be utilized to increase the corrosion rate in a HF vapor clean. Such high temperatures, as is well known, increase the thermal budget and cause further undesired impurities, as well as the potential for structural degradation. In the high volume production of semiconductor devices, the cost, time, and throughput of devices is extremely important, and each has a great affect on profitability. There is a need for reducing the cost of IC fabrication, while still maintaining a long useful life of the fabrication equipment and effectively cleaning surfaces on the wafers. There is a further need for an effective cost reduced in-situ cleaning method for the production of semiconductor devices. There is also a need to provide such in-situ cleaning for furnaces capable of processing large batches of semiconductor devices.

SUMMARY OF THE INVENTION

In a furnace, a method of precleaning surfaces on a semiconductor substrate in-situ, comprises the steps of: forming a first layer to be cleaned on a substrate; pulsing a reactive gas in the furnace at a temperature of between approximately 250 to 950 degrees C.; and forming a second layer on top of the cleaned first layer. The pulsing step comprises pulsing at least one reactant gas, comprising $NF_3$ and $GeH_4$, with at least one dilutant gas, comprised of at least one of the following: Ar, $H_2$, HBr, and HCl. Partial pressure of the reactant gas is between approximately $10^{-8}$ and 700 Torr and the gas is flowed at a pressure of between approximately $4\times10^3$ and $20\times10^3$ Torr. The furnace is comprised of either a horizontal batch-type, a vertical batch-type, or a single wafer chamber. Single wafer chamber furnaces comprise the following: a rapid thermal processing chamber (RTP), a plasma-type chamber, or a rapid thermal chemical vapor deposition (RTCVD) chamber.

In the fabrication of dynamic random access memory (DRAM) chips, the first layer comprises a polysilicon bottom plate electrode for a DRAM capacitive cell and the second layer comprises a dielectric. In further embodiments, the first layer comprises amorphous silicon and the second layer comprises a hemispherical grain polysilicon bottom plate electrode for a DRAM capacitive cell. In further embodiments of the invention, further precleans are performed, wherein the first layer comprises a hemispherical grain polysilicon bottom plate electrode for a DRAM and the second layer comprises a dielectric.

In the fabrication of transistors, such as isolated gate field effect transistors, the first layer comprises active areas of isolated gate field effect transistors and the second layer comprises an oxide layer. Further embodiments of the invention comprise $N_2O$, or a thin grown oxide, as the second layer and the further step of annealing in an $NH_3$ environment following the formation of the oxide.

In the fabrication of contact holes, the first layer comprises an insulating layer, which defines a contact hole, and the second layer comprises a silicide. Subsequent layers include TiN, deposited by chemical vapor deposition, and a metal, such as aluminum or tungsten. Further embodiments comprise metal as the second layer.

Precleaning semiconductor surfaces, in accordance with one of the embodiments of the invention, decreases the thermal budget of the process. Furthermore, the invention increases the throughput of the processing steps, as there is no need to move the wafers to a different environment in order to clean the surfaces.

A method for in-situ cleaning of equipment utilized in processing semiconductor substrates, comprises the steps of: removing the semiconductor substrates from the equipment, which comprises a processing chamber; flowing gas, comprising at least one reactant gas and at least one dilutant gas, in the processing chamber at a temperature of between approximately 300 to 1,000 degrees Celsius; pulsing the reactant gas; and, purging the processing chamber. The equipment comprises one of the following: a horizontal batch processing furnace, a vertical batch processing furnace, or a single wafer chamber. Single wafer chambers are comprised of a rapid thermal processing chamber, a plasma-type chamber, or a rapid thermal chemical vapor deposition chamber.

The reactant gas comprises at least one of $NF_3$ and $GeH_4$, and the dilutant gas comprises at least one of the following: Ar, $H_2$, HBr, and HCl. Partial pressure of the reactant gas is between approximately $10^{-8}$ and 700 Torr and the gas is flowed at a pressure of between approximately $4\times10^3$ and $20\times10^3$ Torr. The purging step comprises flowing inert gas in the processing chamber.

Such in-situ cleans remove deposited material from furnace walls and tubes. In an alternate embodiment, such cleans are performed after multiple deposition steps. Cleaning the furnace also decreases the possibility of contamination from prior-deposited materials. The method of this invention can be applied towards cleaning any processing equipment used in the manufacture of semiconductor devices.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Figure 1:
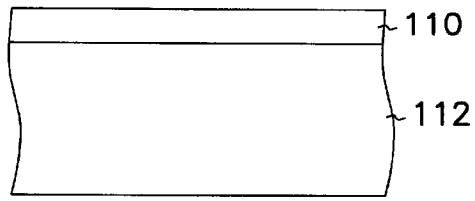
FIG. 1 is a cross-sectional representation of a gate oxide layer formed after being cleaned in accordance with the present invention.

In the formation of a transistor, such as an insulated-gate field effect transistor, a gate is formed on a semiconductor substrate. The first layer formed is a gate oxide layer 110 on the substrate 112, as shown in FIG. 1. Prior to forming the gate oxide layer 110, the semiconductor substrate 112 is precleaned in accordance with the method of the invention. The precleaning step is followed by deposition of a $N_2O$ layer, or another thin oxide film which forms the gate oxide 110, and a $NH_3$ postanneal, to passivate the surface. Precleaning the surface in such a way allows for use of thinner gate oxides 110 due to the surface modifications resulting from the preclean. The method of the invention smooths rough surfaces and removes impurities on semiconductor surfaces. Precleaning can be performed on any semiconductor surface, prior to forming any type of gate oxide layer 110.

In one embodiment, precleaning is performed by applying a diluted reactant gas, $NF_3$, to the substrate 112, as shown in FIG. 1, which is situated in a furnace. The furnace type comprises one of the following: horizontal batch, vertical batch, or single wafer. Single wafer furnaces comprise rapid thermal processing chambers (RTP), plasma-type chambers, or rapid thermal chemical vapor deposition (RTCVD) chambers. $NF_3$ is applied in a pulsed flow, diluted in hydrogen, and pulsed at a temperature of between approximately 250 to 950 degrees Celsius. Further embodiments of the invention comprise utilizing argon, or a similar inert gas, in combination with hydrogen, or alone, as a dilutant gas species.

Pulsing allows precise control of the reactant gas, resulting in better control of surface properties. Maintaining a constant concentration of gases in the furnace chamber at all times is critical when using highly dilute gases. Sampling frequency is adjusted accordingly to maintain a constant concentration at all times. The desired concentration of the reactant gas is chosen from a range of a few parts per million to a few parts per billion.

Pulsing is applied either to a premixture of gases in a reactor before sending them into the furnace chamber, or to gases within the furnace chamber itself. Preferably, the same furnace is used as in the formation of a previous layer, or the next layer, to avoid having to move the substrate.

Pulsing occurs at a low reactant gas partial pressure of between $10^{-8}$ to 700 Torr. Pressure in the furnace chamber is maintained at between approximately $4\times10^3$ to $20\times10^3$ Torr. High-aspect ratio (i.e., ratio of depth to width) holes are able to be modified using such high pressures. Furthermore, when high pressures are used, temperatures at which modification occurs are much lower than those enabled using conventional techniques.

Subsequent processing steps comprise depositing a gate oxide layer, such as $N_2O$, and annealing in $NH_3$. Annealing in an $NH_3$ ambient passivates the gate oxide layer surface.

After each precleaning step, the process chamber is purged to remove remaining gases by stopping reactant gas flows, flowing an inert gas, and pumping the chamber down to near vacuum levels. By cleaning with a pulsed gas in combination with a low temperature anneal, more reliable gate dielectrics are formed. The process is much easier to implement since wafers need not be moved to different process machines between formation of subsequent layers due to the cleaning requirement. This in turn saves time and labor, as well as thermal budget by lowering the cleaning temperature in conjunction with using batch cleaning methods.

In another embodiment of the invention, a diluted reactant gas, germane ($GeH_4$), is applied to the substrate 112, as shown in FIG. 1, which is situated in a furnace. The furnace type can be: horizontal batch, vertical batch, or single wafer (RTP, RTCVD, or plasma-type). Germane is applied in a pulsed flow, diluted in hydrogen, and pulsed at a temperature of between approximately 250 to 950 degrees Celsius.

Further embodiments of the invention comprise utilizing argon, or a similar inert gas, in combination with hydrogen, or alone, as a dilutant gas species. In yet a further embodiment, germane gas is diluted in a halogen-containing gas (such as HCl, or HBr). The halogen species effectively remove metallic contaminants. Furthermore, a different germanium-containing gas may be used, without departing from the scope of the invention. Such gases comprise the following: $GeH_4$, $Ge_2H_6$, $Ge_3H_8$, $GeH_3Br$, $GeH_3Cl$, $GeF_3Cl$, $GeH_2Br_2$, $GeH_2Cl_2$, $GeCl_2F_2$, $GeHCl_3$, $GeCl_2F_2$, $GeCl_4$, $GeBr_4$, and $GeHBr_3$. The concentration of the germane-containing reactant gas species ranges from between a few parts per million to a few parts per billion. Trace amounts of the halogen-containing gases are all that are need to remove metallic contaminants.

Pulsing allows precise control of the reactant gases, resulting in better control of surface properties. Maintaining a constant concentration of gases in the furnace chamber at all times is critical when using highly dilute gases. Sampling frequency is adjusted accordingly to maintain a constant concentration at all times.

Pulsing is applied either to a premixture of gases in a reactor before sending them into the furnace chamber, or to gases within the furnace chamber itself. Preferably, the same furnace is used as in the formation of a previous layer, or the next layer, to avoid having to move the substrate.

Pulsing occurs at a low reactant gas partial pressure of between $10^{-8}$ to 700 Torr. Pressure in the furnace chamber is maintained at between approximately $4 \times 10^3$ to $20 \times 10^3$ Torr. High-aspect ratio (i.e., ratio of depth to width) holes are able to be modified using such high pressures. Furthermore, when high pressures are used, temperatures at which modification occurs are much lower than those enabled using conventional techniques. Germane gas is able to be used at low temperatures of between approximately 250 to 950 degrees Celsius to reduce native oxides because germane reacts with native oxides to form germanium oxides ($GeO_2$ or $GeO$). Increasing the furnace chamber pressure during the pulsing step allows for sublimation to occur at lower temperatures than in previously utilized conventional techniques.

Subsequent processing steps comprise depositing a gate oxide layer, such as $N_2O$, and annealing in $NH_3$. Annealing in an $NH_3$ ambient passivates the gate oxide layer surface. However, subsequent processing steps can, instead, comprise growing a thin oxide layer, such as $SiO_2$, and then depositing a thick oxide layer, such as $N_2O$, and annealing in $NH_3$.

After each precleaning step, the process chamber is purged to remove remaining gases by stopping the reactant gas flows, flowing an inert gas, and pumping the chamber down to near vacuum levels. By cleaning with a pulsed gas in combination with a low temperature anneal, more reliable gate dielectrics are formed. The process is much easier to implement since silicon wafers need not be moved to different process machines between formation of subsequent layers due to the cleaning requirement. This in turn saves time and labor, as well as thermal budget by lowering the cleaning temperature in conjunction with using batch cleaning methods.

Figure 2:
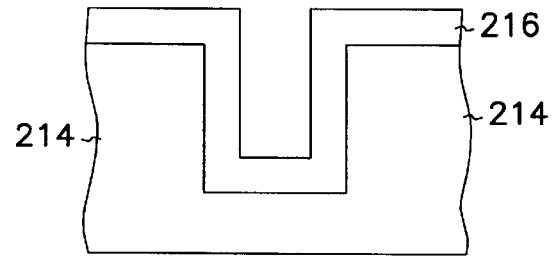
FIG. 2 is a cross-sectional representation of a DRAM container-type cell prior to being cleaned in accordance with the present invention.

A semiconductor wafer indicated at 214 in FIG. 2 is made up of a number of different layers of material to form devices such as dynamic random access memory (DRAM) chips, on a semiconductor substrate 214. An important part of the formation of such layers is the cleaning of a newly formed layer to remove impurities and create a clean surface for the formation of the next layer. Demands for increased capacity memory chips make removal of oxides and impurities a crucial step in achieving those demands.

Figure 3:
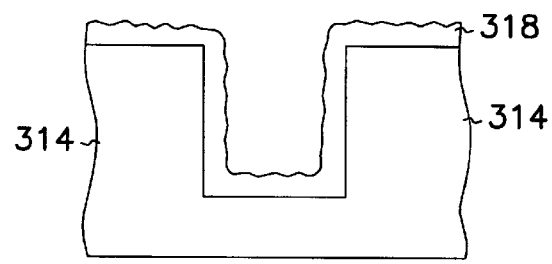
FIG. 3 is a cross-sectional representation of a DRAM bottom plate electrode formed in a container-type cell after being cleaned in accordance with the present invention.

As indicated in FIG. 2, an amorphous silicon layer 216 is formed of n+doped silicon and serves as a bottom plate for a memory cell capacitor shown in FIG. 2 is a trenched capacitor. Trenched capacitors are utilized to increase the circuit density on a chip. In order to increase the capacitance, processing steps are taken to roughen the surface of the bottom plate 216. One such method is annealing the deposited amorphous silicon at a temperature of between approximately 580 to 650 degrees Celsius and a pressure of between approximately $10^{-7}$ to $10^{-8}$ Torr for approximately one to ten minutes, to form a layer 318 of hemispherical grain (HSG) polysilicon on the semiconductor substrate 314, as shown in FIG. 3. Prior to annealing the deposited amorphous silicon layer 216 in FIG. 2 to form the HSG layer 318 in FIG. 3, a precleaning step is performed, utilizing one of the embodiments described previously. In further embodiments of the invention, the bottom plate electrode may be formed according to other methods well known in the art. For example, it may comprise a polysilicon film. In that case, there is no need for the precleaning step recited above, because a HSG layer is not formed.

Figure 4:
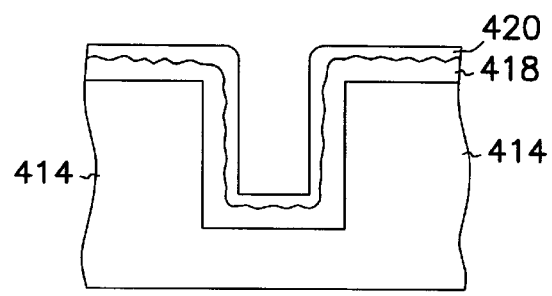
FIG. 4 is a cross-sectional representation of a DRAM capacitive layer formed in a container-type cell after being cleaned in accordance with the present invention.

It is important that a thin dielectric layer 420 then be formed over the bottom plate electrode 418 in a DRAM cell to provide a dielectric layer 420 for the DRAM cell on the semiconductor substrate 414, as shown in FIG. 4. A thinner dielectric layer 420 allows a smaller distance between the top and bottom capacitor plates, forming a stronger capacitor. Stronger capacitors provide better memory cell characteristics. However, one danger of forming a thin dielectric layer is that it may not adequately electrically isolate the plates, resulting in poor cell characteristics. Precleaning the bottom plate 418, after converting the amorphous silicon layer to the HSG layer 418 and prior to formation of the dielectric layer 420, is an important step in helping to eliminate such dangers. However, if the bottom plate electrode 418 is comprised of a plain, polysilicon film, such as that shown in FIG. 3 at 316, precleaning occurs subsequent to deposition of the polysilicon film 316 and prior to formation of the dielectric layer.

After each precleaning, the process chamber is purged to remove remaining gases by stopping the reactant gas flows, flowing inert gas, and pumping the chamber down to near vacuum levels. By cleaning with a pulsed gas in combination with a low temperature anneal, more reliable capacitor dielectrics are formed. The process is much easier to implement since silicon wafers need not be moved to different process machines between formation of subsequent layers due to the cleaning requirement. This in turn saves time and labor, as well as thermal budget by lowering the cleaning temperature in conjunction with using batch cleaning methods.

Precleans in accordance with the present invention are also performed during formation of contacts. Contacts are formed to connect active device areas via metal interconnect lines. A contact hole opening 522 is defined within an insulating layer 524 on an active device region, shown in general at 526.

Figure 5:
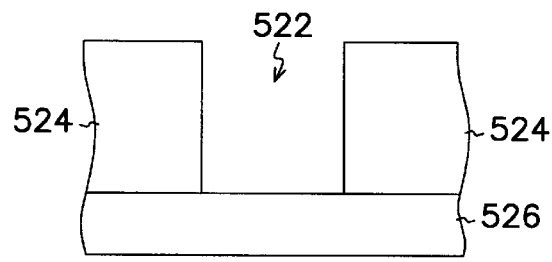
FIG. 5 is a cross-sectional representation of a contact hole prior to being cleaned in accordance with the present invention.
Figure 6:
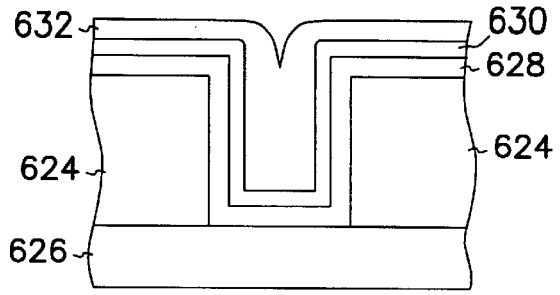
FIG. 6 is a cross-sectional representation of a contact hole after being cleaned in accordance with the present invention and metallized.

A layer of silicide 628 is then formed in accordance with methods well known in the art, as shown in FIG. 6. Such methods typically include deposition of a refractory metal, such as titanium, and annealing. However, other methods for forming silicides are well known in the art. Insulating layer 524 and active device region 526 are renumbered as 624 and 626 in FIG. 6. Prior to formation of the silicide layer 628, the contact hole 522, shown in FIG. 5, is precleaned in accordance with any of the methods of the present invention, as recited previously. Subsequent to formation of the silicide layer 628, process steps well known in the art complete formation of the contact. Typically, a titanium nitride layer 630 is deposited by CVD, and a metal layer 632 such as aluminum, or tungsten, is then deposited over the structure. By precleaning contacts prior to silicidation, the resistance of the contacts is decreased, forming better contacts. The method of the invention can, however, be applied to precleaning contact hole surfaces prior to metallization, in which suicides are not utilized, without departing from the scope of the invention. In that case, the first layer to be precleaned is an insulating layer, and the second layer comprises a metal.

In-situ equipment cleans are performed after wafers are removed from the furnace. Such cleans remove deposited material from furnace walls and tubes. The furnace comprises a vertical batch furnace, a horizontal batch furnace, or a single wafer chamber furnace. Single wafer chamber furnaces comprise RTP, RTCVD, or plasmatype systems.

Such furnace cleans are performed after each deposition step. The cleaning process is comprised of three steps. The first step comprises introducing reactant and dilutant gases into the furnace, without pulsing them. The reactant gases and dilutant gases used are the same as described previously. Furthermore, they are applied in the same concentration, temperature, and pressure ranges. The second step comprises pulsing germane, $NF_3$, or a mixture of both gases, in a manner as described previously in relation to the in-situ wafer precleans. The third step comprises purging the furnace chamber with inert gases. During equipment cleans, the furnace is maintained at elevated temperatures of between approximately 300 to 1,000 degrees C. However, the process is more flexible than that employed in precleaning wafers in-situ.

In an alternate embodiment, such cleans are performed after multiple deposition steps. Cleaning the furnace removes the possibility of subsequent deposition contamination from the prior-deposited materials. Cleaning in accordance with the present invention reduces the thermal budget considerably during the fabrication process.

It is to be understood that the above description is intended to be illustrative, and not restrictive. At any point in the fabrication process during which a preclean step is necessary, the invention can be utilized. The method of the invention can be utilized to clean any equipment utilized in the manufacture of semiconductor devices. The results of using the invention are a decrease in thermal budget and an increase in the throughput of the fabrication process. Many other embodiments will be apparent to those of skill in the art upon reviewing the above description. The scope of the invention should, therefore, be determined with reference to the appended claims, along with the full scope of equivalents to which such claims are entitled.

What is claimed is:

1. In a furnace, a method of precleaning surfaces on a semiconductor substrate in-situ, comprising:
   a) forming a first layer to be cleaned on a substrate;
   b) pulsing at least one reactant gas, comprising $NF_3$ and $GeH_4$ in the furnace, wherein the pulsing step comprises a processing chamber reactant gas partial pressure of between approximately $10^{-8}$ and 700 Torr, and wherein the pulsing step comprises a processing chamber pressure of between approximately $4 \times 10^3$ and $20 \times 10^3$ Torr, at a temperature of between approximately 250 to 950 degrees Celsius; and,
   c) forming a second layer on top of the cleaned first layer.

2. The method of claim 1, wherein the first layer comprises amorphous silicon.

3. The method of claim 2, wherein the second layer comprises a hemispherical grain polysilicon bottom plate electrode for a dynamic random access memory device capacitive cell.

4. The method of claim 1, wherein the first layer comprises a polysilicon bottom plate electrode for a dynamic random access memory device capacitive cell.

5. The method of claim 1, wherein the first layer comprises a hemispherical grain polysilicon bottom plate electrode for a dynamic random access memory device capacitive cell.

6. The method of claim 1, wherein the second layer comprises a dielectric layer.

7. The method of claim 1, wherein the first layer comprises a semiconductor substrate and the second layer comprises an oxide layer.

8. The method of claim 7, wherein the second layer comprises $N_2O$, and further comprising the step of annealing in an $NH_3$ environment following the formation of the second layer.

9. The method of claim 7, wherein the second layer comprises a thin grown oxide and further comprising the steps of depositing a thick oxide layer and annealing in an $NH_3$ environment following the formation of the second layer.

10. The method of claim 1, wherein the first layer comprises an insulating layer, which defines a contact hole, and the second layer comprises a silicide.

11. The method of claim 1, wherein the first layer comprises an insulating layer, which defines a contact hole, and the second layer comprises a metal.

12. The method of claim 1, wherein the pulsing step comprises pulsing at least one reactant gas, comprising $NF_3$ and $GeH_4$, with another gas, comprised of at least one of the following: Ar, $H_2$, HBr, and HCl.

13. The method of claim 1, wherein the furnace is comprised of either a horizontal batch-type, a vertical batch-type, or a single wafer chamber.

14. The method of claim 13, wherein the single wafer chamber is comprised of a rapid thermal processing chamber, a plasma-type chamber, or a rapid thermal chemical vapor deposition chamber.

15. In a furnace, a method of precleaning surfaces on a semiconductor substrate in-situ, comprising the steps of:
   a) forming a first layer to be cleaned on a substrate;
   b) providing $NF_3$ and $GeH_4$ in the furnace at a temperature of between approximately 250 to 950 degrees Celsius and a partial pressure of between approximately $10^{-8}$ and 700 Torr to clean the first layer; and,
   c) forming a second layer on top of the cleaned first layer.

16. A method for in-situ cleaning of equipment utilized in processing semiconductor substrates, comprising the steps of:
   a) removing the semiconductor substrates from the equipment, which comprises a processing chamber;
   b) flowing gas, comprising at least one reactant gas and at least one dilutant gas, in the processing chamber at a temperature of between approximately 300 to 1,000 degrees Celsius and a reactant gas partial pressure of between approximately $10^{-8}$ and 700 Torr; and,
   c) purging the processing chamber.

17. In a furnace, a method of precleaning surfaces on a semiconductor substrate in-situ, comprising:
   forming a first layer to be cleaned on a substrate; and
   pulsing at least one reactant gas, comprising $NF_3$ and $GeH_4$ in the furnace, wherein the pulsing step comprises a processing chamber reactant gas partial pressure of between approximately $10^{-8}$ and 700 Torr, and wherein the pulsing step comprises a processing chamber pressure of between approximately $4 \times 10^3$ and $20 \times 10^3$ Torr, at a temperature of between approximately 250 to 950 degrees Celsius.

18. The method of claim 17, wherein the first layer comprises a polysilicon bottom plate electrode for a dynamic random access memory device capacitive cell.

19. The method of claim 17, wherein the first layer comprises a hemispherical grain polysilicon bottom plate electrode for a dynamic random access memory device capacitive cell.

20. The method of claim 17, wherein the pulsing step comprises pulsing at least one reactant gas, comprising $NF_3$ and $GeH_4$, with another gas, comprised of at least one of the following: Ar, $H_2$, HBr, and HCl.

21. In a furnace, a method of precleaning surfaces on a semiconductor substrate in-situ, comprising:

a) forming a first layer to be cleaned on a substrate;

b) pulsing at least one reactant gas, comprising $GeH_4$ in the furnace, wherein the pulsing step comprises a processing chamber reactant gas partial pressure of between approximately $10^{-8}$ and 700 Torr, and wherein the pulsing step comprises a processing chamber pressure of between approximately $4\times10^3$ and $20\times10^3$ Torr, at a temperature of between approximately 250 to 950 degrees Celsius to clean the first layer; and, c) forming a second layer on top of the cleaned first layer following cleaning of the first layer.

22. The method of claim 21, wherein the first layer comprises a polysilicon bottom plate electrode for a dynamic random access memory device capacitive cell.

23. The method of claim 21, wherein the first layer comprises a hemispherical grain polysilicon bottom plate electrode for a dynamic random access memory device capacitive cell.

24. The method of claim 21, wherein the pulsing step comprises pulsing at least one reactant gas, comprising $NF_3$ and $GeH_4$, with another gas, comprised of at least one of the following: Ar, $H_2$, HBr, and HCl.

25. The method of claim 21, wherein the second layer comprises a dielectric layer.

26. The method of claim 21, wherein the first layer comprises a semiconductor substrate and the second layer comprises an oxide layer.

27. The method of claim 21, wherein the second layer comprises $N_2O$, and further comprising the step of annealing in an $NH_3$ environment following the formation of the second layer.

28. The method of claim 21, wherein the second layer comprises a thin grown oxide and further comprising the steps of depositing a thick oxide layer and annealing in an $NH_3$ environment following the formation of the second layer.

29. The method of claim 21, wherein the first layer comprises an insulating layer, which defines a contact hole, and the second layer comprises a silicide.

30. The method of claim 21, wherein the first layer comprises an insulating layer, which defines a contact hole, and the second layer comprises a metal.

31. In a furnace, a method of precleaning surfaces on a semiconductor substrate in-situ, comprising:

a) forming a first layer to be cleaned on a substrate; and b) pulsing at least one reactant gas, comprising $GeH_4$ in the furnace, wherein the pulsing step comprises a processing chamber reactant gas partial pressure of between approximately $10^{-8}$ and 700 Torr, and wherein the pulsing step comprises a processing chamber pressure of between approximately $4\times10^3$ and $20\times10^3$ Torr, at a temperature of between approximately 250 to 950 degrees Celsius.

32. In a furnace, a method of precleaning surfaces on a semiconductor substrate in-situ, comprising:

forming a first layer to be cleaned on a substrate; and pulsing at least one of $NF_3$ and $GeH_4$ with a dilutant gas comprised of at least one of the following: Ar, $H_2$, HBr, and HCl to clean the first layer, wherein the pulsing step comprises a processing chamber reactant gas partial pressure of between approximately $10^{-8}$ and 700 Torr, and wherein the pulsing step comprises a processing chamber pressure of between approximately $4\times10^3$ and $20\times10^3$ Torr.

33. In a furnace, a method of precleaning surfaces on a semiconductor substrate in-situ, comprising:

pulsing at least one of $NF_3$ and $GeH_4$ with a dilutant gas comprised of at least one of the following: Ar, $H_2$, HBr, and HCl to clean the substrate, wherein the pulsing step comprises a processing chamber reactant gas partial pressure of between approximately $10^{-8}$ and 700 Torr, and wherein the pulsing step comprises a processing chamber pressure of between approximately $4\times10^3$ and $20\times10^3$ Torr.

* * * * *